(12) United States Patent
Ni et al.

(10) Patent No.: US 9,433,973 B1
(45) Date of Patent: Sep. 6, 2016

(54) UV CURING APPARATUS

(71) Applicant: TAIWAN SEMICONDUCTOR MANUFACTURING CO., LTD., Hsinchu (TW)

(72) Inventors: Hsueh-Kuang Ni, New Taipei (TW); Chi-Jen Chen, Taichung (TW); Peng-Cheng Hong, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/739,893

(22) Filed: Jun. 15, 2015

(51) Int. Cl.
*H01J 37/20* (2006.01)
*B05D 3/06* (2006.01)

(52) U.S. Cl.
CPC .................... *B05D 3/067* (2013.01)

(58) Field of Classification Search
CPC ...................................... B05D 3/067

USPC .......................................... 250/504 R, 455.11
See application file for complete search history.

(56) References Cited

U.S. PATENT DOCUMENTS

2010/0275845 A1* 11/2010 Kogure ............... C23C 16/4409 118/722
2012/0162976 A1* 6/2012 Claeys ................ B41F 23/0409 362/218

\* cited by examiner

*Primary Examiner* — Michael Maskell
(74) *Attorney, Agent, or Firm* — Maschoff Brennan

(57) ABSTRACT

A UV curing apparatus includes a processing chamber, a UV light source disposed above the processing chamber, a window disposed between the processing chamber and the UV light source for allowing a UV light from the UV light source passing through and entering the processing chamber, a sealing ring disposed between the processing chamber and the window for sealing the processing chamber, and a light shading kit disposed between the UV light source and the sealing ring for preventing the sealing ring from being exposed of the UV light. Therefore the sealing ring is not exposed of UV light directly, and the bonding of the rubber sealing ring would not be destroyed.

20 Claims, 5 Drawing Sheets

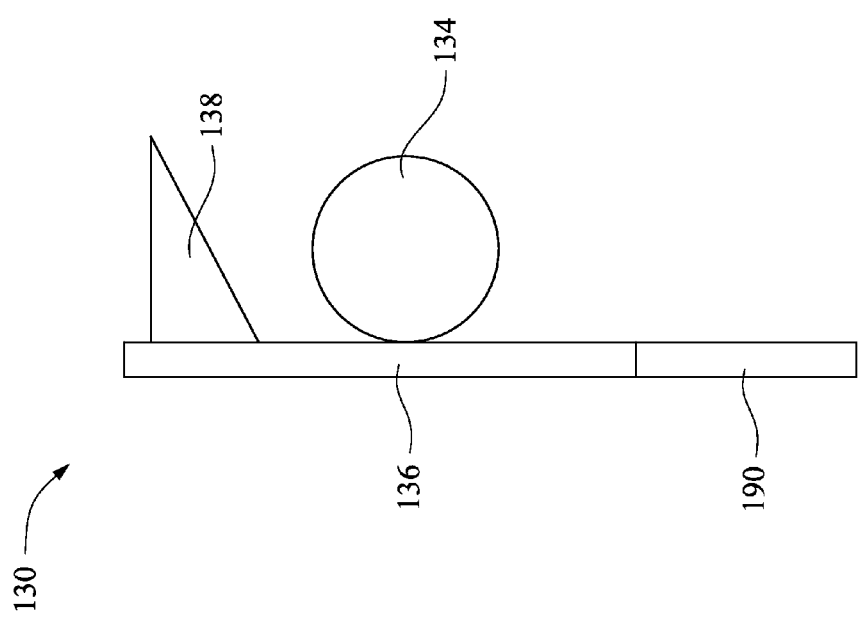

UV CURING APPARATUS

BACKGROUND

Low-k dielectric films may be deposited on a wafer by various CVD (chemical vapor deposition) or spin-on processes. These dielectric materials are cured after deposition by irradiation with UV light for many reasons including improving and/or restoring the physical properties to the film material such as increasing elastic modulus or hardness to improve mechanical strength for higher packaging yields and/or to better withstand post-film deposition processes such as etching, chemical cleaning, CMP (chemical mechanical polishing), wire bonding, etc. In addition, UV curing is used to repair damage to the film caused by chemicals such as fluorine and nitrogen, and to restore the low-k properties of the film which may increase during some post-film deposition processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a cross-sectional view of a portion of UV light source 130, in accordance with some embodiments of the present disclosure.

DETAILED DESCRIPTION

Figure 1:
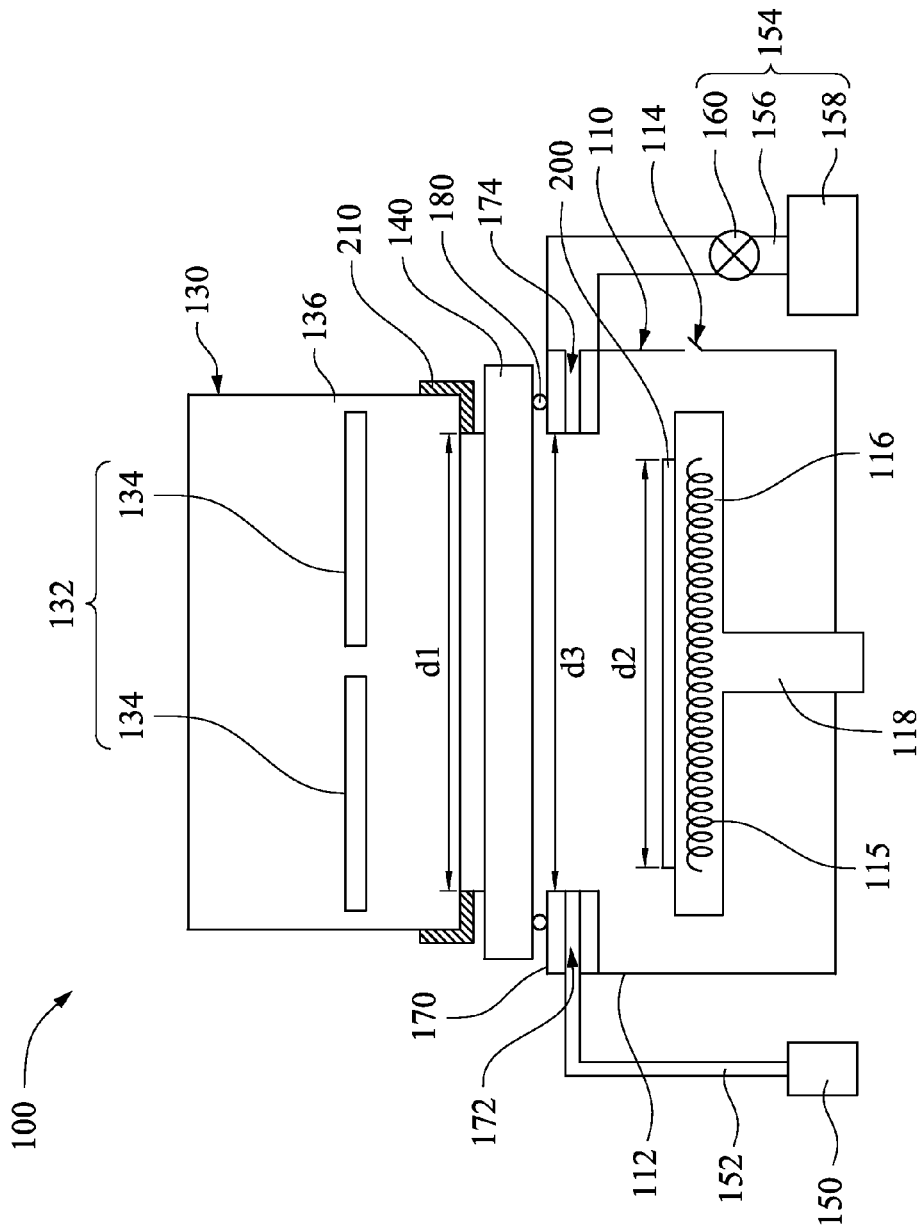
FIG. 1 is a schematic diagram of an exemplary embodiment of a UV curing apparatus according to the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During UV curing of low-k dielectric films, it is desirable to maintain uniform UV curing intensity over the entire surface of the wafer to avoid problems such as film shrinkage at portions of the wafer that may be disproportionately exposed to greater levels of irradiation which may result in variability in device performance. Therefore, there is a need to provide a UV apparatus with lifetime prolong and defect improvement.

FIG. 1 is a schematic diagram of an exemplary embodiment of a UV curing apparatus according to the present disclosure. The UV curing apparatus 100 includes a processing chamber 110 having an enclosure 112 defining a UV irradiation processing room therein. The enclosure 112 includes at least one slit opening 114 for loading and unloading wafers 200 from the processing chamber 110.

The UV curing apparatus 100 includes a wafer holder 116 disposed above the bottom of the processing chamber 110. The wafer holder 116 has a generally circular shaped platter which is configured and structured to support the wafer 200. The wafer 200 includes a semiconductor substrate, in which the semiconductor substrate is made of, for example, silicon; a compound semiconductor, such as silicon carbide, indium arsenide, or indium phosphide; or an alloy semiconductor, such as silicon germanium carbide, gallium arsenic phosphide, or gallium indium phosphide. The wafer 200 may also include various doped regions, dielectric features, or multilevel interconnects in the semiconductor substrate. The film of dielectric material is deposited on the surface of the wafer 200 for being cured.

In some embodiments, the wafer holder 116 includes a ceramic material. The wafer holder 116 is coupled by a shaft 118 to a lift mechanism (not shown). The shaft 118 may lower the wafer holder 116 to a transfer position to allow the wafer 200 entering the processing chamber 110 to be placed on the wafer holder 116. The shaft 118 may raise the wafer holder 116 to a predetermined processing position. The shaft 116 is coupled to a rotary mechanism (not shown). The wafer holder 116 can be rotated by the shaft 118, thus the wafer 200 thereon is exposed of the UV light uniformly. The wafer holder 116 further includes a heater 115, such that the wafer holder 116 and the wafer 200 thereon can be heated to a predetermined temperature during the UV curing process.

The wafer 200 can be held on the wafer holder 116 by using an electrostatic charge, a mechanical clamp, a vacuum clamp, or gravity. The wafer 200 on the wafer holder 116 can be heated by applying optical techniques (tungsten filament lamps, lasers), thermal radiation techniques, or by using susceptors and radio frequency (RF) induction heating.

In some embodiments, an automated material handling system (AMHS) may be used to deliver a wafer cassette or carrier such as a FOUP (front opening unified pod) holding a plurality of unprocessed wafers to the processing chamber 110. In some embodiments, the unprocessed wafers 200 are loaded into the processing chamber 110 via the same path as the processed wafers 200 being unloaded from the processing chamber 110. Alternatively, the path of the unprocessed wafers 200 loading into the processing chamber 110 is different from that of unloading the processed wafers 200.

The UV curing apparatus 100 further includes a UV light source 130 including a UV lamp unit 132 for emitting UV wavelength radiation. The UV lamp unit 132 includes an array or plurality of UV lamps 134 arranged on the sidewalls 136 of the UV light source 130. The wafer 200 is positioned in optical view of UV lamp unit 132 within the processing chamber 110 to receive UV radiation for film curing.

FIG. 2 is a cross-sectional view of a portion of UV light source 130, in accordance with some embodiments of the present disclosure. The UV lamps 134 are fastened on the sidewall 136 of the UV light source 130. Accordingly, in some embodiments, the lamp unit 132 is fixed and stationary in position. In some embodiments, the UV light source 130 includes first reflectors 138 which include portions extending above ° C. each of the UV lamps 134 to reflect the UV light downwards towards the processing chamber, thereby enhancing the irradiation and curing of a dielectric film such as a low-K film previously deposited on the wafer by any suitable means including CVD (chemical vapor deposition) or spin-on.

The first reflectors 138 are positioned proximate to the UV lamps 134 to enhance reflection of the UV radiation. The first reflectors 138 may have any suitable configuration, and in the exemplary embodiment shown has an undulating angled or zigzag pattern as shown in FIG. 2. Individual UV lamps 134 are positioned within each recess formed by the angled reflector unit. In other embodiments, the first reflectors 138 may be concave shaped wherein an individual UV lamp 134 is positioned below each of a plurality of concave shaped reflectors similarly to the angle reflector arrangement shown in FIG. 2.

The UV light source 130 further includes a second reflector 190 connected to the bottom of the first reflectors 138. The UV light reflected by the first reflectors 138 are further reflected by the second reflector 190, and then the UV light reflected by the second reflector 190 enters the processing chamber 110 (see FIG. 1) for curing the dielectric film on the wafer. The second reflector 190 is arranged at the bottom portion of the UV light source 130 and facing processing chamber 110.

The first reflectors 138 and the second reflector 190 may be made of any suitable coated or uncoated metal having a reflective surface finish or coating which is operable to reflect UV radiation. In the embodiments, the first reflectors 138 and the second reflector 190 can be made of aluminum or aluminum alloy, and the surfaces of the first reflector 138 and the second reflector 190 are treated by surface treatment, such as by an aluminum anodization process. In the aluminum anodization processes, the aluminum oxide is grown down into the surface and out from the surface by equal amounts. The anodized aluminum layer is grown by passing a direct current through an electrolytic solution, with the aluminum object, i.e. the reflectors 138 and 190 serving as the anode (the positive electrode). The current releases hydrogen at the cathode (the negative electrode) and oxygen at the surface of the reflectors 138 and 138 as the aluminum anode, creating a build-up of aluminum oxide. Alternating current and pulsed current is also possible but rarely used. The voltage required by various solutions may range from 1 to 300 V DC, although most fall in the range of 15 to 21 V. Higher voltages are typically required for thicker coatings formed in sulfuric and organic acid. The anodizing current varies with the area of aluminum being anodized, and typically ranges from 30 to 300 amperes/meter$^2$ (2.8 to 28 ampere/ft$^2$).

Any suitable type of UV lamps 134 or source may be used including without limitation mercury and excimer lamps, mercury microwave arc lamps, pulsed xenon flash lamps, UV light emitting diodes, etc. In some embodiments, the UV lamps 134 are elongated tube-type UV lamps which are arranged in spaced and parallel relationship to each other. The UV lamps 134 may be powered by any suitable power supply usable to energize the lamps. The UV lamps 134 may be selected to produce UV radiation having any appropriate wavelength for the process requirements encountered. As an example, without limitation, the UV radiation wavelength used may be in the range from about 193 nm to 500 nm.

Reference is made back to FIG. 1. The UV curing apparatus 100 includes a UV transparent window such as quartz window 140 separates and isolates the active wafer processing chamber 110 and UV light source 130. The quartz window 140 is therefore positioned and seated above the wafer 200 to operatively seal the processing chamber 1100 from the ambient environment and UV light source 130. The quartz window 140 prevents out-gassing from the wafer 200 from reaching and contaminating the UV lamps 134. The quartz window 140 is a transparent plate and operates to allow UV wavelength radiation from the lamp unit 132 to be transmitted and pass through the quartz window 140 and irradiate the wafer 200 positioned below the quartz window 140. In some embodiments, the quartz window 140 may be made of synthetic quartz. In some embodiments, the quartz ($SiO_2$) window 140 in the present UV curing apparatus 100 has a size sufficient to all regions of lamp array.

The UV curing apparatus 100 further includes a gas system including a gas supply 150 and a gas evacuation device 154. The gas supply 150 supplies an inert gas to the processing chamber 110 via an inlet conduit 152. The gas can be a cooling gas for maintaining temperatures in processing chamber 110 to a desired level, which may be below 450° C. in some representative non-limiting embodiments. The gas also serves as a purge gas to help remove various organic compounds or other species outgassed from the wafer 200 or the processing chamber 110 during the UV curing processing. In some embodiments, the gas is nitrogen ($N_2$); however, other suitable inert or noble gases may be used. The gas is drawn into and removed from the process chamber 110 by the gas evacuation device 154.

The gas evacuation device 154 includes an outlet conduit 156, a vacuum pump 158, and a valve 160. An end of the outlet conduit 156 is connected to the processing chamber 110, and another end of the outlet chamber 110 is connected to the vacuum pump 158. The valve 160 is connected to the outlet conduit 156 and disposed between the vacuum pump 158 and the processing chamber 110.

In some embodiments, the outlet conduit 156 is connected to the vacuum pump 158 in which the processing chamber 110 is operated under pressure less than atmospheric. In various embodiments, the processing chamber 110 may be held at a vacuum, atmospheric (less than 10 ton), or positive pressures by the operating of the vacuum pump 158.

The UV curing apparatus 100 includes a supporter 170 disposed at the top of the processing chamber 110 to support quartz window 140. The supporter 170 is in a ring shape, such that the UV light can pass through the hole of the supporter 170 and enters the processing chamber 110. The supporter 170 may include a plurality of gas dispensing passages 172 connected to the inlet conduit 154 for allowing the gas from the gas supply 150 and the inlet conduit 154 passing through and entering the processing chamber 110. The openings of the gas dispensing passages 172 are led to the inner surface of the supporter 170. The supporter 170 further includes a plurality of outlet passages 174 connected to the outlet conduit 156. The gas within the processing chamber 110 is guided to the outlet passages 174 and removed by the gas evacuation device 154.

The UV curing apparatus 100 further includes a sealing ring 180 disposed between the quartz window 140 and the processing chamber 110 to seal the processing chamber 110. In some embodiments, the sealing ring 180 is sandwiched by the supporter 170 and the quartz window 140. In order to seal the processing chamber 110, the sealing ring 180 is made of compressible material, such as rubber or other suitable material. The rubber can be, for example, ethylene propylene rubber (EPDM/EPM), nitrile rubber (NBR), natural rubber (NR), styrene butadien rubber (SBR), chloroprene rubber (CR), silicone (VMQ/MVQ/HTV), acrylic rubber (ACM), hydrogenated nitrile butadiene rubber (HNBR), or fluoro rubber (FKM).

The sealing ring 180 is in a ring shape, and thus the UV light (the UV wavelength radiation) may pass through the space encircled by the sealing ring 180 and the underlying quartz window 140.

Since the sealing ring 180 is made of compressible material, such as rubber, the sealing ring 180 is sensitive to the UV light. Namely, the rubber sealing ring 180 may be defected caused by being exposed to the UV light. The defections of the sealing ring 180 can be observed as cracking, peeling, chalking, color changes and other surface defects. For instance, the sealing ring 180 bonding may broken after long time exposed of the UV light, and contaminations peeled from the rubber sealing ring 180 may be carried by the gas and fall into the processing chamber 110. The contaminations may deposit on the wafer 200, and the surface of the dielectric layer may be rough and the performance of the component on the wafer 200 may be reduced.

Therefore, the UV curing apparatus 100 of the present disclosure further includes at least one light shading kit 210 disposed between the UV light source 130 and the sealing ring 180 to prevent the sealing ring 180 from being damaged by being exposed of the UV light.

In some embodiments, the one or more light shading kits 210 are assembled to cover the edge of the bottom of the UV light source 130, such that a portion of the UV light from the UV light source 130 emitting to the sealing ring 180 is blocked by the light shading kits 210, and thus the sealing ring 180 under the UV light source 130 is protected by the light shading kits 210 and would not be exposed of the UV light directly. Therefore, the sealing ring 180 made of rubber would not be damaged because of being long-time exposed of the UV light.

Figure 3A:
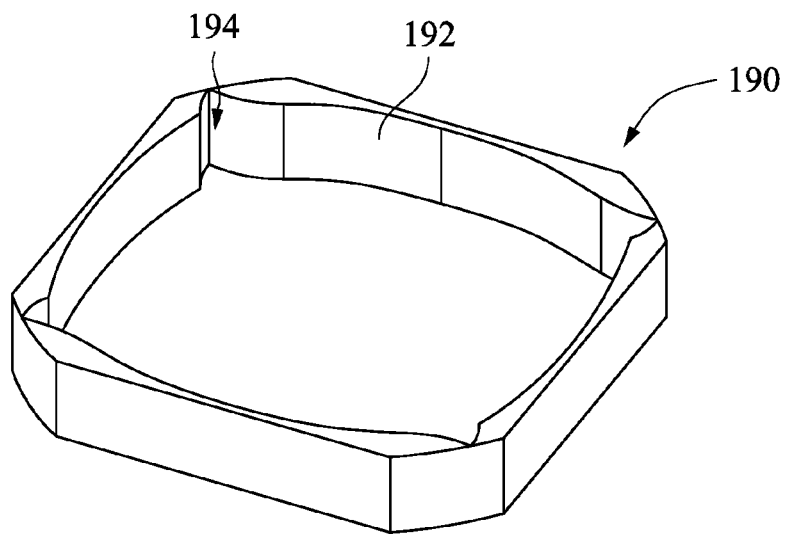
FIG. 3A and FIG. 3B are oblique views of different assembling states viewed from the bottom of the second reflector, in accordance with some embodiments of the disclosure.
Figure 3B:
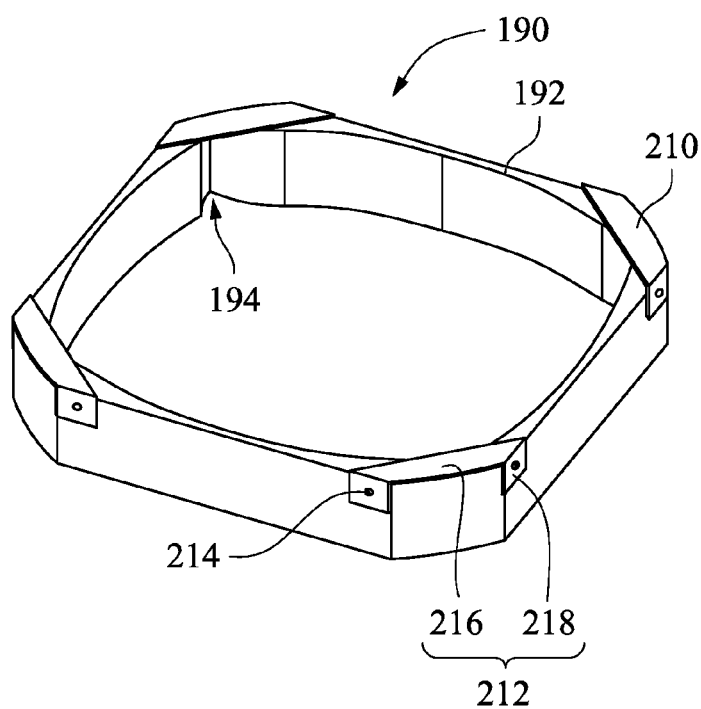

Reference is made to FIG. 3A and FIG. 3B. FIG. 3A and FIG. 3B are oblique views of different assembling states viewed from the bottom of the second reflector, in accordance with some embodiments of the disclosure. Referring to FIG. 3A, the second reflector 190 is composed of plural bars 192, and the bars 192 are connected to each other by welding or screwing. In some embodiments, the inner surface of each bar 192 is a curved surface, and the bars 192 are arranged as a circle. However, because of the fabrication limitation, some unwanted spaces 194 might be formed at the boundary of two adjacent bars 192. Thus the sealing ring 180 (see FIG. 1) uncovered by the bars 192 (e.g. the portion under the spaces 194) is exposed of the UV light.

Therefore, the light shading kits 210 are provided, as shown in FIG. 3B, to block the UV light which emits to the sealing ring 180 directly. The light shading kits 210 are arranged above or under the spaces 194, such that the UV light passes through the spaces 194 is blocked by the light shading kits 210.

Each of the light shading kits 210 includes a shading piece 212 and a fastener 214 for fastening the shading piece 212 on the second reflector 190. In some embodiments, the shading piece 212 includes a top plate 216 and two side plates 218 extending from two opposite ends of the top plate 216. The side plates 218 are arranged substantially vertical to the top plate 216. The top plate 216 can be regarded as a bottom plate in different view. The top plates 216 are utilized to cover the spaces 194, such that portions of the sealing ring 180 (see FIG. 1) exposed of the spaces 194 are blocked by the top plate 216, and the UV light does not emit onto the sealing ring 180 directly. In some embodiments, the fastener 214 includes plural screws, and the screws screw the side plates 218 on the second reflector 190. The light shading kits 210 can be made of materials which can shield the UV light, such as the aluminum or aluminum alloy.

Reference is made to both FIG. 1 and FIG. 3B. The light shading kits 210 are assembled at the second reflector 190 to block the UV light emitting to the sealing ring 180 and allow the UV light passing through the quartz window 140. In some embodiments, the distance d1 between two diagonal light shading kits 210 is larger than the diameter d2 of the wafer 200. In some embodiments, the diameter d3 of the hole of the supporter 170 is larger than the diameter d2 of the wafer 200. Thus the UV light provided by the UV light source 130 passes through the quartz window 140 and the hole of the supporter 170 and enters the processing chamber 110. The distance d1 between opposite light shading kits 210 can be larger than, equal to, or smaller than the diameter d3 of the hole of the supporter 170. The sealing ring 180 is shielded by the second reflector 190 and the light shading kits 210. Therefore the sealing ring 180 is not exposed of UV light directly, and the bonding of the rubber sealing ring 180 would not be destroyed.

Figure 4:
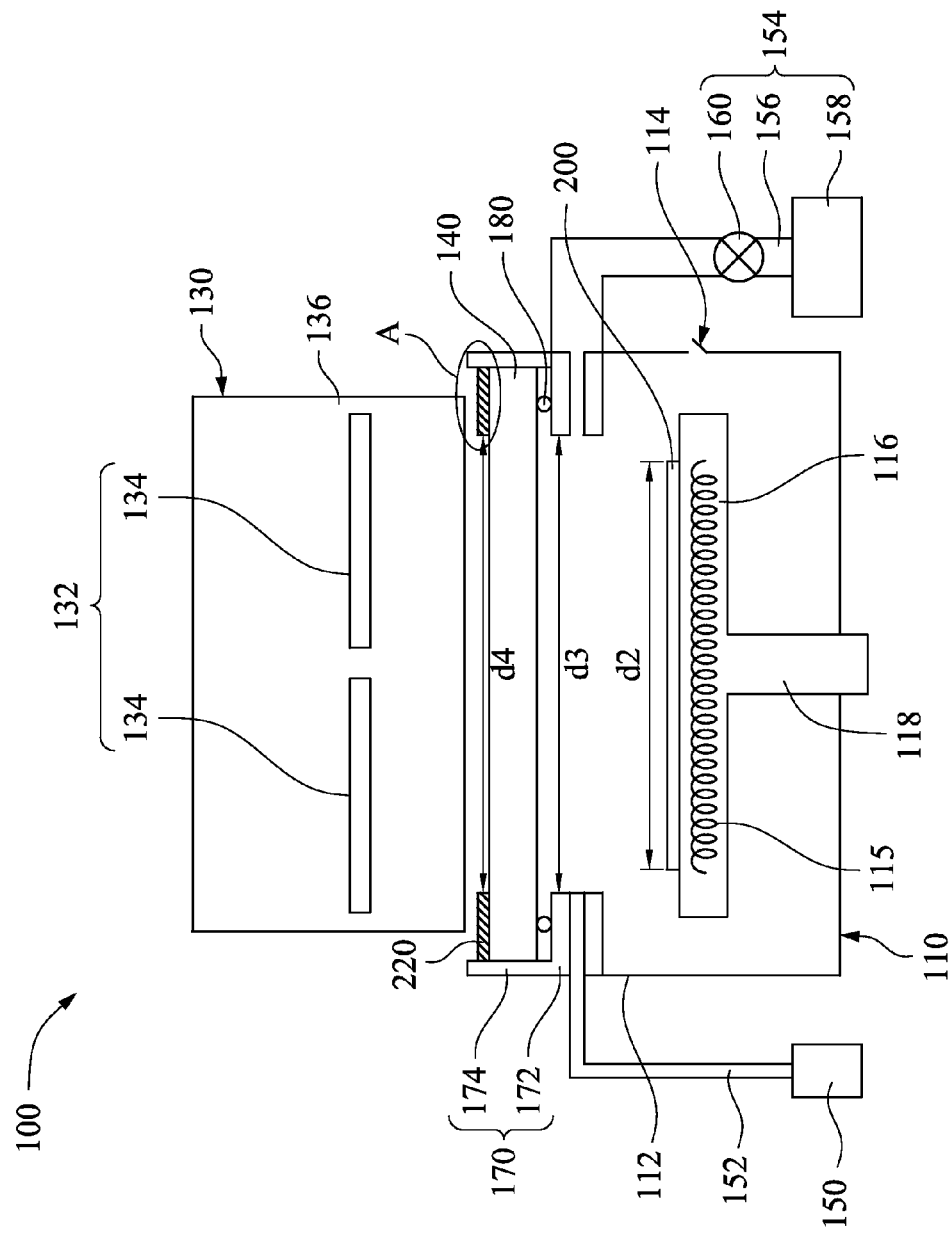
FIG. 4 shows a schematic view of a UV curing apparatus according to some embodiments of the disclosure.

Reference is made to both FIG. 4, in which FIG. 4 shows a schematic view of a UV curing apparatus according to some embodiments of the disclosure. The UV curing apparatus 100 includes a processing chamber 110 having an enclosure 112 defining a UV irradiation processing room therein. The enclosure 112 includes at least one slit opening 114 for loading and unloading wafers 200 from the processing chamber 110. The UV curing apparatus 100 includes a wafer holder 116 disposed above the bottom of the processing chamber 110. The wafer holder 116 is coupled by a shaft 118 to a lift mechanism (not shown). The shaft 118 may lower the wafer holder 116 to a transfer position to allow the wafer 200 entering the processing chamber 110 to be placed on the wafer holder 116. The shaft 118 may raise the wafer holder 116 to a predetermined processing position. The shaft 116 is coupled to a rotary mechanism (not shown). The wafer holder 116 can be rotated by the shaft 118, thus the wafer 200 thereon is exposed of the UV light uniformly. The wafer holder 116 further includes a heater 115, such that the wafer holder 116 and the wafer 200 thereon can be heated to a predetermined temperature during the UV curing process.

The UV curing apparatus 100 further includes a UV light source 130 including a UV lamp unit 132 for emitting UV wavelength radiation. The UV lamp unit 132 includes an array or plurality of UV lamps 134 arranged on the sidewalls 136 of the UV light source 130. The wafer 200 is positioned in optical view of UV lamp unit 132 within the processing chamber 110 to receive UV radiation for film curing.

The UV curing apparatus 100 includes a UV transparent window such as quartz window 140 separates and isolates the active wafer processing chamber 110 and UV light source 130. The quartz window 140 is therefore positioned and seated above the wafer 200 to operatively seal the processing chamber 110 from the ambient environment and UV light source 130. The quartz window 140 prevents out-gassing from the wafer 200 from reaching and contaminating the UV lamps 134. The quartz window 140 is a transparent plate and operates to allow UV wavelength radiation from the lamp unit 132 to be transmitted and pass through the quartz window 140 and irradiate the wafer 200 positioned below the quartz window 140.

The UV curing apparatus 100 further includes a gas system including a gas supply 150 and a gas evacuation device 154. The gas supply 150 supplies an inert gas to the processing chamber 110 via an inlet conduit 152. The gas evacuation device 154 includes an outlet conduit 156, a vacuum pump 158, and a valve 160. In some embodiments, the outlet conduit 156 is connected to the vacuum pump 158 in which the processing chamber 110 is operated under pressure less than atmospheric. In various embodiments, the processing chamber 110 may be held at a vacuum, atmospheric (less than 10 ton), or positive pressures by the operating of the vacuum pump 158.

The UV curing apparatus 100 includes a supporter 170 disposed at the top of the processing chamber 110 to support quartz window 140. The supporter 170 is in a ring shape, such that the UV light can pass through the hole of the supporter 170 and enters the processing chamber 110. The supporter 170 has a flange 172 protruding toward the hole of the supporter 170, and the quartz window is supported by the flange 172. Namely, the supporter 170 has a sidewall 174 standing on the flange 172, and the quartz window 140 is disposed on the flange 172 and against the sidewall 174.

The UV curing apparatus 100 further includes a sealing ring 180 disposed between the quartz window 140 and the processing chamber 110 to seal the processing chamber 110. In some embodiments, the sealing ring 180 is disposed between the flange 172 and the quartz window 140. In order to prevent the sealing ring 180 from being damaged due to exposing of UV light, the UV curing apparatus 100 further includes a light shading kit 220 disposed between the UV light source 130 and the sealing ring 180 to prevent the UV light emitting onto the sealing ring 180 directly.

In some embodiments, the light shading kit 220 is a metal ring made of material having high tolerance to UV light, such as aluminum or aluminum alloy. The surface of the light shading kit 220 can be surface treatment. The ring shape light shading kit 220 is disposed on and contact with the quartz window 140 and the supporter 170. The light shading kit 220 covers the edge portion of the quartz window 140 and also covers the sealing ring 180 right under the edge portion of the quartz window 140.

The light shading kit 220 can be fastened on the supporter 170. In some embodiments, the light shading kit 220 is screwed on the sidewall 174 of the supporter 170. The light shading kit 220 is assembled to the supporter 170 in the atmosphere, and the screwing position and the sealing ring 180 are at opposite sides of the quartz window 140, thus the sealing state of the processing chamber 110 would not be destroyed by the screw holes of the supporter 170.

The light shading kits 220 are assembled to block the UV light emitting to the sealing ring 180 and allow the UV light passing through the quartz window 140. In some embodiments, the distance d4 of the inner diameter of the light shading kit 220 is larger than the diameter d2 of the wafer 200. In some embodiments, the diameter d3 of the hole of the supporter 170 is larger than the diameter d2 of the wafer 200. Thus the UV light provided by the UV light source 130 passes through the quartz window 140 and the hole of the supporter 170 and enters the processing chamber 110. The inner diameter d4 of the light shading kit 220 can be larger than, equal to, or smaller than the diameter d3 of the hole of the supporter 170. The sealing ring 180 is shielded by the light shading kits 220. Therefore the sealing ring 180 is not exposed of UV light directly, and the bonding of the rubber sealing ring 180 would not be destroyed.

Figure 5:
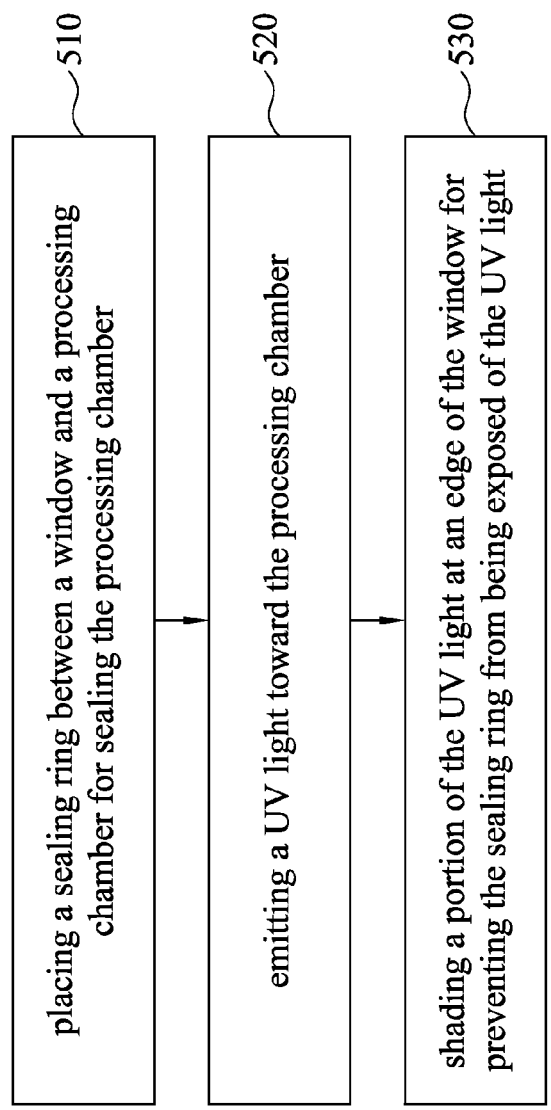
FIG. 5 is a flow chart of a UV curing method according to some embodiments of the disclosure.

Referring to FIG. 5, which is a flow chart of a UV curing method according to some embodiments of the disclosure. In step 510, a sealing ring is placed between a window and a processing chamber for sealing the processing chamber. The sealing ring, for example, is sandwiched between a supporter on the processing chamber and the window.

In step 520, a UV light is emitted toward the processing chamber. A wafer or wafers are loaded into the processing chamber 110, and the UV light is utilized to cure the dielectric layer on the surface of the wafer.

In step 530, a portion of the UV light at an edge of the window is shaded for preventing the sealing ring from being exposed of the UV light. The UV light at the main middle area of the window still passes through the window and enters the processing chamber 110. The UV light can be shaded by for example, the light shading kit as described above.

By using the light shading kit shielding the sealing ring, the sealing ring is not exposed of UV light directly, such that the damages of the sealing ring can be prevented.

According to some embodiments of the disclosure, a UV curing apparatus includes a processing chamber, a UV light source disposed above the processing chamber, a window disposed between the processing chamber and the UV light source for allowing a UV light from the UV light source passing through and entering the processing chamber, a sealing ring disposed between the processing chamber and the window for sealing the processing chamber, and a light shading kit disposed between the UV light source and the sealing ring for preventing the sealing ring from being exposed of the UV light.

According to some embodiments of the disclosure, a UV curing apparatus includes a processing chamber, a UV light source disposed above the processing chamber, a supporter disposed on the processing chamber, a window supported by the supporter for allowing a UV light from the UV light source passing through and entering the processing chamber, a sealing ring disposed between the supporter and the window for sealing the processing chamber, and a light shading kit disposed between the supporter and the UV light source for shading the UV light emitting onto the sealing ring.

According to some embodiments of the disclosure, a UV curing method includes placing a sealing ring between a window and a processing chamber for sealing the processing chamber; emitting a UV light toward the processing chamber; and shading a portion of the UV light at an edge of the window for preventing the sealing ring from being exposed of the UV light.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A UV curing apparatus comprising:
    a processing chamber;
    a UV light source disposed above the processing chamber and comprising a reflector;
    a window disposed between the processing chamber and the UV light source for allowing a UV light from the UV light source to pass through and to enter the processing chamber;
    a sealing ring disposed between the processing chamber and the window for sealing the processing chamber; and
    a light shading kit assembled on the reflector and disposed between the UV light source and the sealing ring for preventing the sealing ring from being exposed to the UV light.

2. The UV curing apparatus of claim 1, wherein the reflector comprises a plurality of bars connected to each other, and a space is formed between adjacent bars.

3. The UV curing apparatus of claim 2, wherein the light shading kit covers a portion of the sealing ring to prevent the portion of the sealing ring from being exposed to the UV light passing through the space.

4. The UV curing apparatus of claim 3, wherein the light shading kit comprises a shading piece, the shading piece comprises:
    a top plate that covers the space and the portion of the sealing ring; and
    two side plates that extend from two opposite ends of the top plate and that contact the reflector.

5. The UV curing apparatus of claim 4, wherein the light shading kit comprises a fastener for fastening the side plates to the reflector.

6. The UV curing apparatus of claim 1, further comprising a supporter disposed on the processing chamber for supporting the window, wherein the sealing ring is sandwiched by the window and the supporter.

7. The UV curing apparatus of claim 6, wherein the supporter comprises a flange and a sidewall standing on the flange, wherein the window is supported by the flange.

8. The UV curing apparatus of claim 7, wherein the sealing ring is sandwiched between the flange and the window.

9. The UV curing apparatus of claim 8, wherein the light shading kit covers an edge portion of the window and the sealing ring.

10. The UV curing apparatus of claim 7, wherein the light shading kit is made of metal.

11. The UV curing apparatus of claim 1, wherein the sealing ring is made of rubber.

12. The UV curing apparatus of claim 1, wherein the window is a quartz window.

13. The UV curing apparatus of claim 1, wherein the light shading kit is made of aluminum or aluminum alloy.

14. The UV curing apparatus of claim 1, further comprising a holder disposed in the processing chamber for holding a substrate, wherein the substrate receives the UV light through the window.

15. A UV curing apparatus comprising:
    a processing chamber;
    a UV light source disposed above the processing chamber, wherein the UV light source comprises a reflector formed by connecting a plurality of bars, and a space is formed between adjacent bars;
    a supporter disposed on the processing chamber;
    a window supported by the supporter for allowing a UV light from the UV light source passing through and entering the processing chamber;
    a sealing ring disposed between the supporter and the window for sealing the processing chamber; and
    a light shading kit disposed between the supporter and the UV light source for preventing the UV light from emitting through the space onto the sealing ring.

16. The UV curing apparatus of claim 15, wherein the light shading kit is fastened on the supporter and covers an edge portion of the window and the sealing ring.

17. The UV curing apparatus of claim 15, wherein the light shading kit is assembled to the reflector and covers a portion of the sealing ring that would otherwise be exposed to the UV light passing through the space.

18. The UV curing apparatus of claim 15, wherein the light shading kit is made of metal.

19. The UV curing apparatus of claim 15, wherein an inner surface of each of the bars is a curved surface.

20. The UV curing apparatus of claim 15, wherein the bars are connected to each other by weld or screws.

* * * * *